United States Patent [19]

Manlove

[11] Patent Number: 5,498,986
[45] Date of Patent: Mar. 12, 1996

[54] OXYGEN SENSOR INTERFACE CIRCUIT WITH SIMPLIFIED AMPLIFIER REQUIREMENTS

[75] Inventor: Gregory J. Manlove, Kokomo, Ind.

[73] Assignee: Delco Electronics Corporation, Kokomo, Ind.

[21] Appl. No.: 235,741

[22] Filed: Apr. 29, 1994

[51] Int. Cl.$^6$ .......................... H03K 5/153; H03K 5/22
[52] U.S. Cl. .......................................... 327/77; 327/337
[58] Field of Search ........................... 327/334, 337, 327/554, 63, 65, 77; 330/9, 51

[56] References Cited

U.S. PATENT DOCUMENTS

| | | | |
|---|---|---|---|
| 4,290,034 | 9/1981 | Fraser et al. | 327/554 |
| 4,313,096 | 1/1982 | Fleisher | 327/554 |
| 4,404,525 | 9/1983 | Amir et al. | 327/554 |
| 4,429,281 | 1/1984 | Ito et al. | 327/554 |

OTHER PUBLICATIONS

LM1964 Sensor Interface Amplifier, National Semiconductor, Linear Data Book 3, 1988 Edition, pp. 5–192.

*Primary Examiner*—Toan Tran
*Attorney, Agent, or Firm*—Jimmy L. Funke

[57] ABSTRACT

A sensor interface circuit is provided which realizes common mode rejection and achieves a desired transfer response while realizing a simplified amplifier arrangement. The interface circuit is particularly useful for amplifying and conditioning signals generated by an oxygen sensor on an automotive vehicle. The sensor interface circuit has first and second inputs for receiving input voltages from a sensor which are joined together to provide a differential voltage representative of the voltage potential between the first and second inputs. One input may receive a common mode ground employed by the sensor. An amplifier having a first input receives a differential voltage at an inverting input and a positive non-zero reference voltage at a non-inverting input. The amplifier has an output coupled to a grounded switch for providing an output signal referenced to reference ground. The circuit is particularly useful for automotive applications for interfacing with an oxygen sensor where voltage excursions may occur between the common mode sensor ground and reference ground.

10 Claims, 2 Drawing Sheets

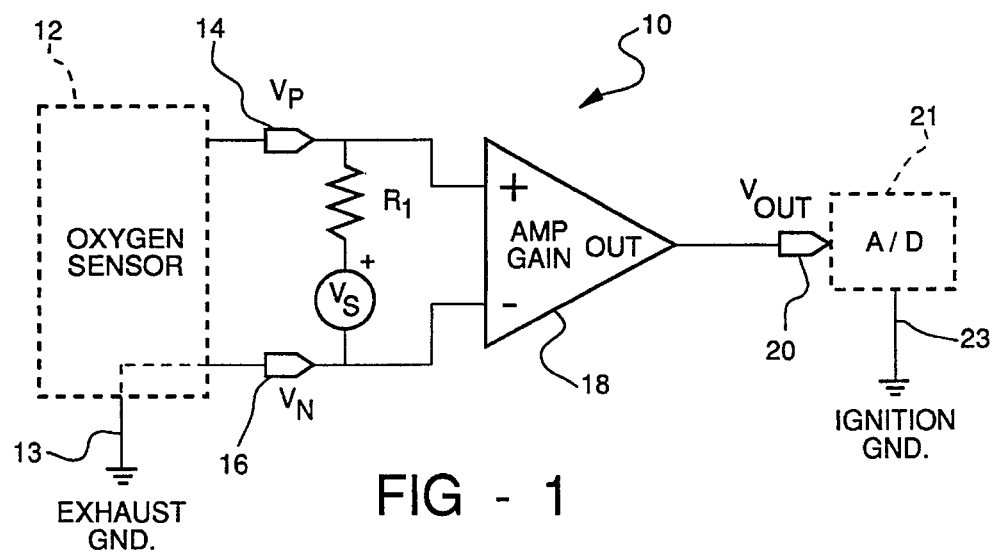
FIG - 1
FIG - 2
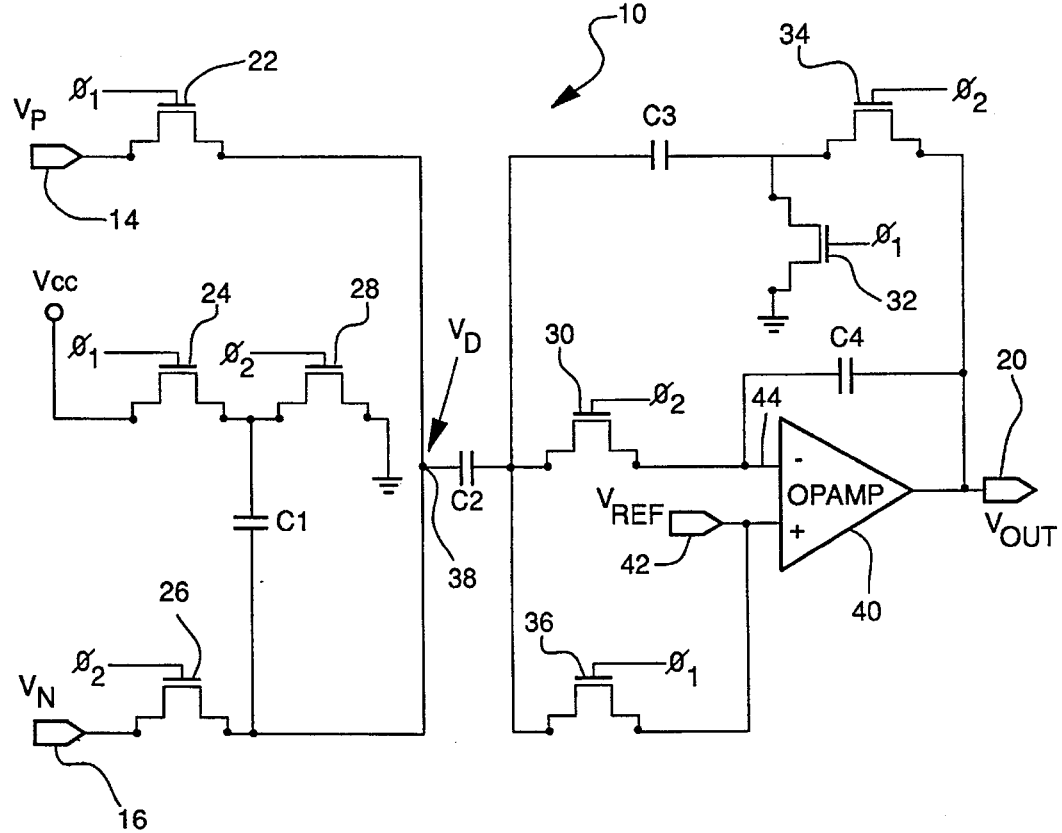

OXYGEN SENSOR INTERFACE CIRCUIT WITH SIMPLIFIED AMPLIFIER REQUIREMENTS

TECHNICAL FIELD

This invention relates generally to a sensor interface circuit and, more particularly, to a circuit for processing sensor signals output from an oxygen sensor such as that employed with an automobile while minimizing amplifier requirements.

DISCUSSION

A sensor interface circuit is generally employed to interface the analog outputs of a sensor with a processing device. This type of interface circuit is typically used to sufficiently amplify and condition the sensor signal as required for further processing. In automotive applications, an oxygen sensor is typically mounted in the exhaust system of an automotive engine, while an oxygen sensor interface circuit is usually mounted in an engine control module, powertrain control module or in combination with some other processing device. In accordance with well known automotive applications, the oxygen sensor signals are commonly used to maintain a stoichiometric air-to-fuel ratio for maintaining proper operation of the catalytic converter.

Since the oxygen sensor is typically located in the engine compartment and is separate from the interface circuit, the interface circuit generally must be capable of rejecting common mode signals. This is because input common mode voltage excursions may be as great as plus or minus two volts with respect to the ground employed by the interface circuit and processing circuitry coupled thereto. Also, in addition to providing a sufficiently amplified signal that may be properly processed, the interface circuit must also be capable of detecting various error conditions such as broken or open wires leading to the sensor.

Conventional oxygen sensor interface circuits have generally included an amplifier equipped with a fixed gain which receives an analog differential voltage across a pair of oxygen sensor output lines. The conventional circuit also includes a small voltage source for generating a known amplifier output which is indicative of either an open lead condition or an extremely cold sensor. One example of a commercially available sensor interface circuit is the sensor interface amplifier Model No. LM1964 which is manufactured by National Semiconductor. The above prior art example is a precision differential amplifier designed for use in the automotive environment in which a sensor is grounded at the engine block while the sensor interface amplifier is grounded at chassis potential.

Conventional sensor interface circuits such as that mentioned above generally employ bipolar transistor and resistor circuitry. However, conventional interface circuits tend to have a number of problems associated therewith. First, matching characteristics of commonly employed resistors are generally not accurate enough to meet the needs of automotive oxygen sensor applications. These inaccuracies typically require both the gain and input referred voltage be adjusted on most every part that is manufactured. This can lead to an expensive and time consuming process. Second, the input impedance of the interface circuit is usually a function of an internal resistor which generally has variations associated therewith due to process and temperature conditions. Variations in the input impedance can adversely affect the transfer response of a given system. Also, the conventional approaches employ operational amplifiers which are connected to a common mode ground. This has the effect of limiting the amplifier operation and complicating the amplifier requirements.

It is therefore desirable to provide for an interface circuit that interfaces with sensor output signals to process the signals and realize a desired transfer curve while minimizing amplifier requirements associated therewith.

It is a further object of the present invention to provide for an oxygen sensor interface circuit which employs accurate matching characteristics which generally do not vary or otherwise adversely affect the transfer response of a given system.

It is another object of the present invention to provide for an oxygen sensor interface circuit which employs a switched capacitor circuit topology to achieve a desired transfer response and allows for a simplified amplifier configuration.

It is yet another object of the present invention to provide an oxygen sensor interface circuit that rejects common mode signals to avoid the effects of common mode voltage excursions and still produce an amplified signal referenced to ground.

SUMMARY OF THE INVENTION

In accordance with the teachings of the present invention, a sensor interface circuit is provided for processing input sensor signals which produce a desired transfer response while allowing for a simplified amplifier arrangement. The interface circuit includes first and second inputs for receiving an input voltage from a sensor. The first and second inputs are joined together to provide a differential voltage that is representative of the voltage potential between the first and second inputs. An amplifier is provided having a first input for receiving the differential voltage, a second input, and an output for generating an amplified output signal. A non-zero reference voltage is supplied to the second input of the amplifier. An output is coupled to the amplifier output and also to a grounded switch so as to provide an analog output signal that is referenced to ground. The circuit is particularly useful for automotive applications, especially for interfacing with an oxygen sensor.

BRIEF DESCRIPTION OF THE DRAWINGS

Other objects and advantages of the present invention will become apparent to those skilled in the art upon reading the following detailed description and upon reference to the drawings in which:

FIG. 1 schematic diagram of an oxygen sensor interface circuit coupled to an oxygen sensor;

FIG. 2 is a circuit diagram which provides a more detailed illustration of the oxygen interface circuit according to the present invention.

DETAILED DESCRIPTION OF THE PREFERRED EMBODIMENT

Figure 3:
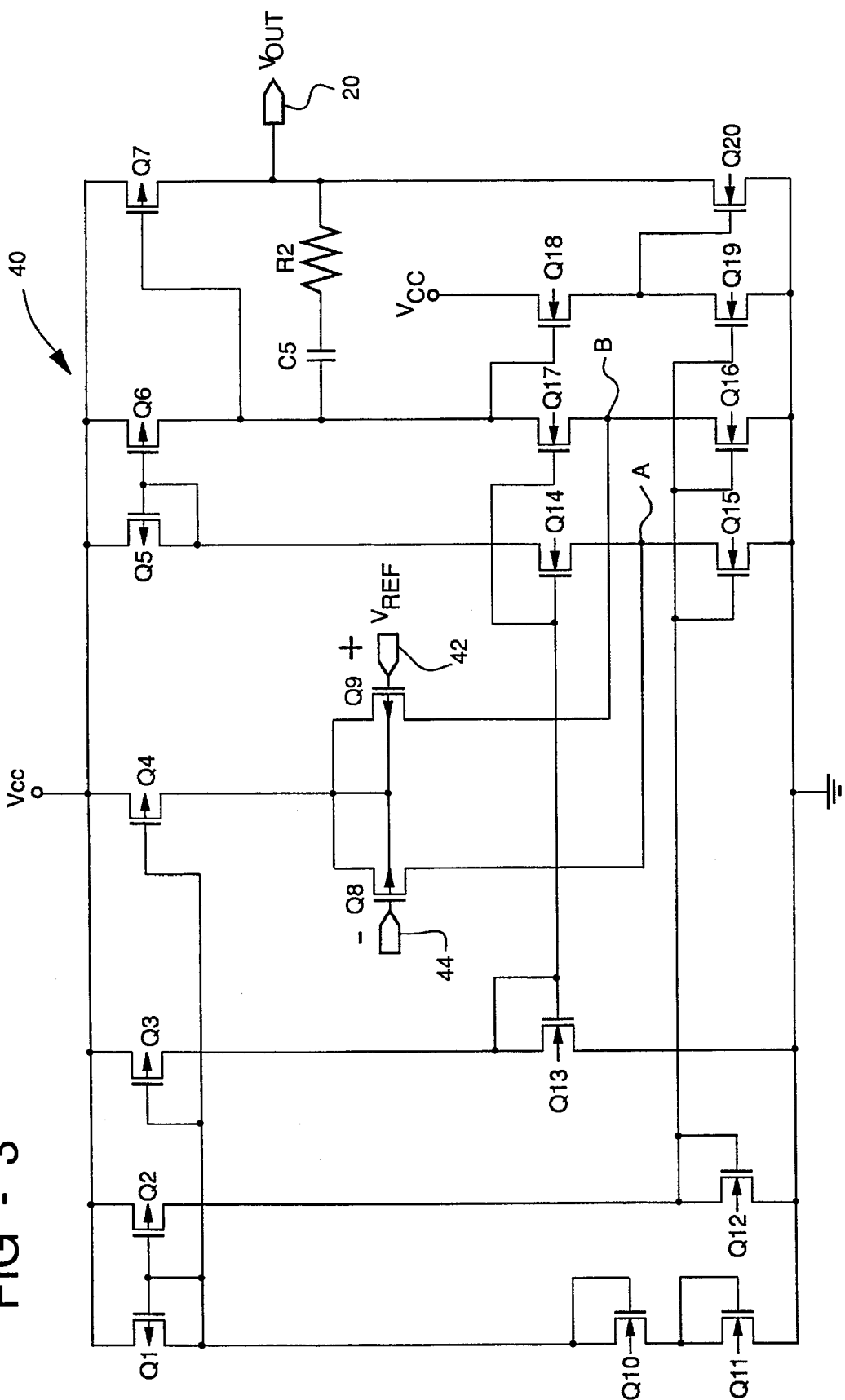
FIG. 3 is a circuit diagram of a simplified operational amplifier configuration that may be employed with the interface circuit.

Turning to FIG. 1, a sensor interface circuit 10 is schematically shown connected to an oxygen sensor 12 in a manner generally required for current automotive applications. The sensor interface circuit 10 is used to interface an oxygen sensor 10 with a processing device such as an analog-to-digital converter 21 which in turn typically feeds an engine control module or powertrain control module (not shown). In doing so, interface circuit 10 provides signal amplification and signal conditioning as required by the particular processing operation. The interface circuit 10 is described in connection with an oxygen sensor interface circuit which is particularly useful for automotive applications. However, it should be appreciated that circuit 10 may also be used to interface with other types of circuits and sensors.

The interface circuit 10 includes a pair of input terminals 14 and 16 for receiving a differential voltage output from the oxygen sensor 12. An amplifier stage 18 is included for producing a predetermined fixed gain. A fixed gain of 4.5 is produced according to one example described herein. The amplifier stage 18 is shown with a positive input connected to the first input terminal 14 and therefore receives a positive portion $V_P$ of the differential voltage. Amplification gain stage 18 is further shown with a negative input coupled to the second input terminal 16 for receiving a reference or negative portion $V_N$ of the differential voltage. The negative portion $V_N$ of the differential voltage is preferably a ground that is employed by sensor 12. In automotive applications, the ground employed by oxygen sensor 12 is commonly connected to the vehicle exhaust system. The exhaust system ground therefore provides the common mode ground for sensor 12 via line 13 to which signal $V_P$ is referenced with. In response, amplification gain stage 18 generates an analog voltage output $V_{OUT}$ via an output terminal 20.

The oxygen sensor interface circuit 10 further includes a constant voltage signal $V_s$ supplied in series with a resistor $R_1$ between the input terminals 14 and 16. According to one example, voltage signal $V_s$ has a direct current (DC) voltage of 450 mV, while resistor $R_1$ has a preferred resistance of about 1.2 Mohms. During normal operation, the voltage signal $V_s$ has a negligible effect on the sensor output signal applied across input terminals 14 and 16, and therefore has a negligible effect on the amplifier output $V_{OUT}$. Under normal operating conditions, the oxygen sensor 12 is generally sufficiently heated so that the effective series resistance is known to be about 100 kohms or less, for example. However, should the sensor leads connected to the input terminals 14 and 16 become an open-circuit, the voltage signal $V_s$ will become the dominant input signal to amplifier stage 18. Likewise, immediately following a cold engine start, when the effective resistance of sensor 12 may be on the order of several megaohms, the voltage signal $V_s$ then also becomes the dominant input signal to amplifier stage 18. Under these circumstances, a direct current (DC) output voltage of 2.025 volts is produced as the amplifier output voltage $V_{OUT}$. When this 2.025 volt output voltage $V_{OUT}$ is sensed for a predetermined period of time, a central processing unit (not shown) detects the presence of a cold sensor or open lead condition.

The oxygen sensor 12 is commonly mounted within the exhaust system of an automobile engine and is typically grounded to the exhaust system ground as shown by ground line 13. Quite often, the exhaust ground is not the same as the ignition ground or engine ground that is commonly employed by the analog-to-digital converter 21 via ground line 23 and also used by other interfaced processing devices that are coupled to the converter 21. However, it is not uncommon to have voltage excursions between the exhaust ground and ignition ground. According to conventional approaches, the AC reference to the amplifier gain stage 18 is generally set equal to the engine ground. This results in serious constraints on the amplifier gain stage 18.

Referring now to FIG. 2, a more detailed illustration of the oxygen sensor interface circuit 10 is shown in accordance with the present invention. The present invention employs a switched capacitor integrated circuit (IC) topology in a manner which provides for a desired transfer response, yet allows for a simplified amplification arrangement. The input terminal 14 which receives the voltage $V_P$ is connected to a switch 22. Likewise, input terminal 16 for receiving voltage $V_N$ is connected to a switch 26. Switches 22 and 26 in turn are coupled together at a common node 38. Accordingly, the voltage potential applied across terminals 14 and 16 are combined to provide a differential voltage $V_D$ at node 38 which is equal to the difference between voltages $V_P$ and $V_N$.

The interface circuit 10 further includes a first capacitor $C_1$ connected at one end to node 38 and in parallel with input terminals 14 and 16. Capacitor $C_1$ is further connected at the other end to an IC chip supply voltage $V_{cc}$ via a switch 24. The other end of capacitor $C_1$ is further coupled to ground via another switch 28.

The circuit 10 further has an operational amplifier (op amp) with non-inverting (positive) and inverting (negative) inputs. A second capacitor $C_2$ is connected to node 38. The inverting input of the operational amplifier 40 is connected to second capacitor $C_2$ via line 44 and a switch 30. Operational amplifier 40 is configured as a fixed gain amplifier to provide a fixed gain. Operational amplifier 40 therefore produces an amplified output voltage $V_{OUT}$ at an output terminal 20. A third capacitor $C_3$ is connected to the second capacitor $C_2$ and in parallel with the operational amplifier 40. A switch 34 is connected in series between the third capacitor $C_3$ and the output terminal 20. In addition, a grounded switch 32 is connected at one end between capacitor $C_3$ and switch 34 and at the other end to ground.

In accordance with the present invention, the operational amplifier 40 as described herein has a reference voltage $V_{REF}$ supplied to the non-inverting input of operational amplifier 40. The reference voltage $V_{REF}$ is a positive non-zero voltage signal with an amplitude selected to provide optimum amplification while minimizing the effects of any stray parasitic capacitances. Voltage reference $V_{REF}$ may include any positive non-zero voltage; However, one should select the optimum voltage necessary to meet the necessary operating performance requirements for a given system, preferably considering the criteria as will be discussed hereinafter.

A fourth capacitor $C_4$ is connected to line 44 in parallel across the inverting input of operational amplifier 40 and the output 20. Capacitor $C_4$ is a first order low pass filter which allows for the realization of a frequency response of say 0 to 350 Hz, according to one example. In addition, a switch 36 is connected between the non-inverting input of the operational amplifier 40 and second capacitor $C_2$.

As previously mentioned, the oxygen sensor interface circuit 10 according to the present invention employs a switched capacitor topology which includes switches 22, 24, 26, 28, 30, 32, 34 and 36. Each of these switches are three terminal devices which include an input for providing a predetermined clocking signal. As shown, switches 22, 24, 32 and 36 each simultaneously receive a first clocking signal $\phi_1$. Switches 26, 28, 30 and 34 each simultaneously receive a second clocking signal $\phi_2$. According to the preferred embodiment, clocking signals $\phi_1$ and $\phi_2$ may each have a sampling rate of 100 kHz and are applied one at a time to achieve a proper two-phase switching operation which should be readily understandable to one in the art.

The switched capacitor interface circuit 10 shown in FIG. 2 minimizes amplifier requirements and can be realized cost-effectively with limited or no component adjustments. By injecting the two-phase clocking of signals $\phi_1$ and $\phi_2$, the switched capacitor topology is able to realize proper resistance characteristics with high accuracy. In addition to avoiding time consuming adjustments, the switched capacitor topology may also minimize the cost of the interface circuit 10. In doing so, the gain and input referred voltage are both a function of capacitor ratios. It is generally known that the impedance of a switched capacitor circuit is equal to $1/Cf_s$, where $f_s$ is the sampling rate (i.e., frequency of signals $\phi_1$ and $\phi_2$).

An on-chip oscillator (not shown) with a free running frequency proportional to 1/C is generally used so the input impedance becomes only a function of the resistor in the oscillator. If the resistor is an accurate external device, the input impedance of the circuit should be maintained regardless of process and temperature variations.

Since the actual sampling rate is inversely proportional to input capacitance, the input impedance will be constant as the capacitance varies. While the absolute value of the capacitors will vary, the circuit gain and open circuit voltages are a function of capacitor ratios. These ratios generally do not change with process and temperature. This keeps the gain and input referred voltage constant, thereby avoiding the need for circuit adjustments. With the two-phase clocking applied, a high clocking pulse in a given switch will provide the sampling frequency $f_s$ thereto and allow for the charging of capacitors associated along a given path. The transfer response achieved with circuit 10 is as follows:

$$V_{OUT}/V_P - V_N = C_2/[C_3 + (1-Z^{-1})C_4] + V_{OFF}/(V_P - V_N) \times C_2 + C_3/[C_3 + (1-Z^{-1})C_4]$$

where $V_{OFF}$ represents voltage offset realized by amplifier 40 and $Z^{-1}$ represents a one clock cycle delay. The voltage offset $V_{OFF}$ is preferably minimized by optimizing the design of the operational amplifier 40. This is accomplished by connecting the non-inverting input of operational amplifier 40 to the voltage reference $V_{REF}$ which allows for the design of an operational amplifier 40 that can realize a low voltage offset $V_{OFF}$.

The overall amplification gain provided by operational amplifier 40 is determined by the ratio of capacitor $C_2$ divided by capacitor $C_3$. In accordance with the example described in connection with the present invention, capacitor $C_2$ has a capacitance of 7.583 pF while capacitor $C_3$ has a capacitance of 1.685 pF. Given the frequency sampling rate of 100 kHz for clocking signals $\phi_1$ and $\phi_2$, the amplifier realizes a gain equal to 4.5. The circuit configuration also determines an offset gain which is generally equal to the gain of the amplifier plus one. Accordingly, the offset gain according to the above example with the present invention equates to about 5.5. The total input capacitance is equal to $C_1 + C_2$ where, given $C_1$ equal to 0.75 pF, the total input capacitance is equal to 8.333 pF. This in turn equates to an input resistance of 1.2 Mohms. As a consequence of the input resistance characteristics, the voltage source $V_s$ value is equal to supply voltage $V_{cc} \times [C_1 \div (C_1 + C_2)]$. Given five volts $V_{cc}$, this equates to a voltage source $V_s$ of 450 mV. The grounded switch 32 on $\phi_1$ of the clock applies $V_{REF}$ to capacitor $C_3$. On $\phi_2$ of the clock, the voltage $V_{REF}$ on capacitor $C_3$ is subtracted off the input charge $V_D(C_1 + C_2)$, thereby referencing $V_{OUT}$ to the ignition ground.

With particular reference to FIG. 3, a preferred embodiment of the operational amplifier 40 is shown therein made up of a plurality of transistors, capacitors and resistors. The operational amplifier 40 as shown in FIG. 3 is a preferred embodiment of one example of a simplified operational amplifier that may be used in accordance with the present invention as shown in FIG. 2. The interface circuit 10 advantageously allows for the use of a simplified operational amplifier 40 as described hereinafter.

Operational amplifier 40 has a common mode range to ground with an input stage configured as a folded cascode circuit. More specifically, a plurality of P-channel transistors Q1 through Q7 are all provided with a source connected to supply voltage $V_{cc}$. Transistors Q1 through Q4 have commonly joined gates which are all connected to the drain of transistor Q1. Transistors Q5 and Q6 have commonly joined gates which are also further connected to the drain of transistor Q5. The drain of transistor Q6 is connected to the gate of transistor Q7, while the drain of transistor Q7 is coupled to the output terminal 20.

The operational amplifier 40 further includes a plurality of N-channel transistors Q10 through Q20. Transistor Q10 has a drain which is connected to the drain of transistor Q1 and which is also connected to a gate of transistor Q10. Transistor Q11 has a drain connected to the source of transistor Q10 and a gate connected thereto also. Transistors Q11, Q12, Q15, Q16, Q19 and Q20 each have a source coupled to ground. Transistor Q12 has a drain coupled to the drain of transistor Q2. Transistors Q12, Q15, Q16 and Q19 each have a gate also coupled to the drain of transistor Q2. Transistor Q13 has a drain coupled to the drain of transistor Q3. Transistors Q13, Q14 and Q17 each have a gate also coupled to the drain of transistor Q3. Transistor Q14 has a drain coupled to the drain of transistor Q5 and a source connected to the drain of transistor Q15. Transistor Q17 has a drain coupled to the drain of transistor Q6 and a source coupled to the drain of transistor Q16. Transistor Q18 has a drain coupled to an input for receiving supply voltage $V_{cc}$ and a gate coupled to the drain of transistor Q17. The source of transistor Q18 is coupled to the drain of transistor Q19 and also coupled to the gate of transistor Q20.

The operational amplifier 40 further includes a pair of P-channel transistors Q8 and Q9 which each have a well terminal connected to one another and the sources joined together. The commonly connected sources and well terminals of transistors Q8 and Q9 in turn are connected to the drain of transistor Q4. Transistor Q8 has a drain coupled to the drain of transistor Q15 while transistor Q9 has a drain coupled to the drain of transistor Q16. The gate of transistor Q8 is connected to the negative input line 44 of operational amplifier 40. Whereas, transistor Q9 has a gate connected to the positive input line 42 of operational amplifier 40 for receiving the reference voltage $V_{REF}$. In addition, an RC series connected circuit made up of capacitor C5 and resistor R2 is coupled between the drain of transistor Q17 and output terminal 20.

According to the operational amplifier 40 arrangement described herein, the operational amplifier 40 receives a voltage $V_D$ input via a negative input 44 and generates an amplified output $V_{OUT}$ via the output terminal 20. The operational amplifier 40 described herein is one example of a preferred embodiment in which one skilled in the art should readily understand after reading the specification. However, it should be appreciated that other operational amplifier configurations may be employed with the present invention.

The preferred criteria to be considered when selecting the reference voltage $V_{REF}$ will now be described. As the reference voltage $V_{REF}$ is increased above ground, the common mode requirements of the amplifier are reduced. If reference voltage $V_{REF}$ were equal to ground, an input level shifter would be needed in the amplifier, which adds offset to the amplifier and is unacceptable for the present invention. By applying a non-zero positive reference voltage $V_{REF}$ according to the present invention, a folded cascode stage can be used at the input of operational amplifier 40 since the voltage potential at nodes A and B can swing $\pm V_{REF}$ without transistors Q15 and Q16 deviating from the active range. The folded cascode stage has a high gain which minimizes the amplifier offsets. Accordingly, the amplifier can thereby be implemented in a simplified configuration.

As reference voltage $V_{REF}$ increases from ground, any capacitances between capacitor C3 and the negative terminal of the operational amplifier 40 in FIG. 2 may begin to cause an error voltage at the output. Therefore, the reference voltage $V_{REF}$ is chosen large enough to allow the voltage at nodes A and B to move as much as needed, considering process and temperature variations, to assure the output $V_{OUT}$ can swing from rail-to-ground. The reference is preferably not made any larger to assure that parasitic devices do not have a significant effect on the amplifier output $V_{OUT}$.

In operation, an oxygen sensor 12 is mounted within an exhaust system on an automobile generally for sensing oxygen for purposes of maintaining the proper air-to-fuel ratio. The present invention provides the sensor interface circuit 10 for receiving a pair of sensor outputs $V_P$ and $V_N$ from the oxygen sensor 12 and amplifying and conditioning the signal for use by a processing device. Voltage outputs $V_P$ and $V_N$ are received via the input terminals 14 and 16 and combined to provide a differential voltage $V_D$. The differential voltage $V_D$ is amplified and processed by the interface circuit 10 to provide an analog output $V_{OUT}$ at output terminal 20. The operation of the switched capacitor circuit is timed with a two-phase clocking scheme. This involves alternately applying first and second clocking signals $\phi_1$ and $\phi_2$ to charge and discharge the capacitors so as to provide a switched capacitor circuit operation. In so doing, the capacitors provide an accurate resistance that does not vary over temperature and process deviations as the capacitance changes over time.

The input differential signals are applied to terminals 14 and 16 and combined at node 38 to provide for a single differential voltage $V_D$ at the inverting input of operational amplifier 40. Operational amplifier 40 receives as an input the differential voltage $V_D$. The non-inverting input of differential amplifier 40 is supplied with a predetermined reference voltage $V_{REF}$. Reference voltage $V_{REF}$ is a positive non-zero voltage which is preferably set close to ground with enough voltage to assure that the voltage potential at nodes A and B can swing far enough to assure that the amplifier output can swing rail-to-ground under all process and temperature conditions.

The operational amplifier 40 amplifies the differential voltage $V_D$ by a fixed amplification gain. The output of operational amplifier 40 in turn is referenced to ground. Accordingly, the output voltage $V_{OUT}$ applied across output terminal 20 is referenced to a ground such as the ignition ground employed by the analog-to-digital converter 21. As a consequence, the interface circuit 10 advantageously achieves common mode rejection for a system that may be subjected to common mode voltage excursions, while at the same time allowing for a simplified amplifier configuration.

While this invention has been disclosed in connection with a particular example thereof, no limitation is intended thereby except as defined in the following claims. This is because a skilled practitioner recognizes that other modifications an be made without departing from the spirit of this invention after studying the specification and drawings.

I claim:

1. A sensor interface circuit for amplifying and processing sensor output signals and rejecting common mode signals, said circuit comprising:

first and second inputs for receiving an output signal from a sensor;

means for joining the first and second inputs so as to provide a differential voltage representative of a voltage potential between said first and second inputs;

an amplifier having a first input for receiving the differential voltage, a second input and an output for providing an amplified output signal;

a non-zero positive reference voltage supplied to the second input of the amplifier; and an output coupled to the amplifier output and means for referencing the output of said amplifier to a reference ground so as to provide an analog output signal referenced to the reference ground.

2. The circuit as defined in claim 1 wherein said sensor output signal includes a sensor ground which is received by said second input and a voltage potential referenced to said sensor ground and received by said first input.

3. The circuit as defined in claim 2 wherein said sensor output signal is output from a sensor grounded to an exhaust system on an automobile.

4. The circuit as defined in claim 3 wherein said sensor output signal is output from an oxygen sensor.

5. An oxygen sensor interface circuit for interfacing oxygen sensor output signals which have a common mode ground with a processing device, said interface circuit comprising:

a first input for receiving an output signal from the oxygen sensor;

a second input for receiving a common mode ground utilized by the oxygen sensor;

means for joining the first and second inputs to generate a differential voltage that is representative of a voltage potential between the first and second inputs;

an amplifier having an inverting input for receiving the differential voltage, a non-inverting input, and an output for providing an amplified output signal;

a reference voltage supplied to the non-inverting input of the amplifier for providing a non-zero positive voltage potential thereto; and an output connected to the amplifier output and means for referencing the output of said amplifier to a reference ground so as to provide an analog output signal that is referenced to the reference ground.

6. The circuit as defined in claim 5 wherein said means for joining and said means for referencing comprise a plurality of capacitors and switches arranged in a switched capacitor topology for responding to multiple phase clocking signals.

7. The circuit as defined in claim 5 wherein said amplifier comprises an operational amplifier having an input stage configured as a folded cascode circuit.

8. The circuit as defined in claim 5 wherein said sensor is mounted on an automobile and grounded separate from said reference ground.

9. An oxygen sensor interface circuit for amplifying and processing oxygen sensor output signals and rejecting common mode signals, said circuit comprising:

a first input for receiving an output signal from an oxygen sensor;

a second input for receiving a common mode ground utilized by the oxygen sensor in an automotive vehicle;

means for joining the first and second inputs to generate a differential voltage that is representative of a voltage potential between the first and second inputs;

an amplifier having an inverting input for receiving the differential voltage, a non-inverting input, and an output for providing an amplified output signal, said amplifier further having an input stage configured as a folded cascode circuit;

a reference voltage supplied to the non-inverting input of the amplifier for providing a non-zero positive voltage potential thereto; and an output connected to the amplifier output and means for referencing the output of said amplifier to a reference ground so as to provide an analog output signal that is referenced to the reference ground;

wherein said means for joining and said means for referencing include a plurality of capacitors coupled to a plurality of phased clocked switches for producing a desired resistance in accordance with a switched capacitor topology.

10. The circuit as defined in claim 9 wherein said sensor is mounted on an automobile and grounded separate from said reference ground.

* * * * *